United States Patent [19]

Yasuho et al.

[11] Patent Number: 5,528,458
[45] Date of Patent: Jun. 18, 1996

[54] INTEGRATED CIRCUIT DEVICE AND ITS MANUFACTURING METHOD

[75] Inventors: Takeo Yasuho, Neyagawa; Hayami Matunaga; Masao Iwata, both of Hirakata; Hitonobu Furukawa, Neyagawa, all of Japan

[73] Assignee: Matsushita Electric Industrial Co., Ltd., Osaka, Japan

[21] Appl. No.: 344,693

[22] Filed: Nov. 18, 1994

[30] Foreign Application Priority Data

Nov. 25, 1993 [JP] Japan ................... 5-295173

[51] Int. Cl.$^6$ ................... H05K 7/20
[52] U.S. Cl. ................... 361/718; 174/268; 257/692; 257/713; 361/704; 361/773
[58] Field of Search ................... 165/80.3, 185; 174/52.2, 252, 260, 268; 257/675, 690, 692, 706, 712, 713, 717; 361/690, 704, 705, 706, 707–709, 712, 713, 717, 718, 719, 722, 749, 789, 760, 772, 773, 776

[56] References Cited

U.S. PATENT DOCUMENTS

| 4,812,949 | 3/1989 | Fontan | 361/386 |
|---|---|---|---|
| 5,173,844 | 12/1992 | Adachi | 361/414 |
| 5,267,867 | 12/1993 | Agahdel | 439/73 |
| 5,331,235 | 7/1994 | Chun | 257/777 |
| 5,386,342 | 1/1995 | Rostoker | 361/749 |
| 5,397,917 | 3/1995 | Ommen | 361/707 |
| 5,398,160 | 3/1995 | Umeda | 361/707 |

Primary Examiner—Gerald P. Tolin
Attorney, Agent, or Firm—Willian Brinks Hofer Gilson & Lione

[57] ABSTRACT

An integrated circuit device is disclosed that comprises a bare integrated circuit chip, having an integrated circuit section and pad sections, said chip being mounted on an insulated surface of a substrate, and an electro-conductive circuit pattern wiring formed on said insulating surface along the periphery of said chip. Tape automated bonding wiring is used to electrically connect the pad sections of the chip to an end of the circuit pattern wiring. Terminals are electrically connected to the other end of the circuit pattern wiring for use in electrically connecting the integrated circuit device to electronic equipment.

6 Claims, 8 Drawing Sheets

INTEGRATED CIRCUIT DEVICE AND ITS MANUFACTURING METHOD

BACKGROUND OF THE INVENTION

The present invention relates to an integrated circuit device used in electronic equipment, such as for example, electric appliances, communications equipment, measurement and control instruments, consumer electronics products or the like, and its manufacturing method.

Integrated circuit devices in the prior art have been manufactured according to the following steps:

First, a bare integrated circuit chip (referred to as a bare IC chip) is mounted on a lead terminal frame which has been prepared by etching or press punching, and then connections between pads formed on the bare IC chip and leads of the lead frame are performed by means of a wire bonding machine.

Then, packaging is applied by use of a molding resin to the bare IC chip including the areas, wherein the foregoing connections between pads and leads have been performed, to realize a specified packaging configuration.

Further, tie-bars of the lead frame are cut off by press cutting, and each respective lead terminal is formed by bending said lead terminal into a specified shape.

In the foregoing prior art integrated circuit device, the spacing between the pads has to be large enough to allow the use of a wire bonding machine in order for the connections between the pads disposed on the bare IC chip and the lead terminals to be performed successfully, and even if the integration density of the integrated circuit section is increased, the spacing between pads in the pad section has not been able to be made smaller correspondingly. As a result, the IC chip has become large, and the integrated circuit device also has tended to be large in dimensions.

SUMMARY OF THE INVENTION

The object of the present invention is to provide a miniaturized integrated circuit device having excellent thermal dissipation.

The integrated circuit device of the present invention comprises:

a substrate with an electrically insulating layer disposed on a first surface thereof;

a bare IC chip mounted on the central part of the first surface of the foregoing substrate;

circuit pattern wiring disposed on the peripheral part of the first surface of the foregoing substrate and electrically connected with TAB wiring;

TAB wiring (wiring formed by a Tape Automated Bonding Method) that extends between said bare chip and said circuit pattern wiring; and terminals connected with the foregoing circuit pattern wiring.

The manufacturing method for the integrated circuit device of the present invention comprises the steps of:

forming an electro-conductive circuit pattern wiring on the peripheral part of a first surface of a substrate;

disposing a bare IC chip on the central part of a first surface of a substrate;

electrically connecting TAB wiring between said circuit pattern wiring and said bare IC chip; and electrically connecting said circuit pattern wiring with terminals.

Another method of manufacturing the integrated circuit device of the present invention is characterized by having the foregoing step of electrically connecting said circuit pattern wiring with the terminals comprises the steps of:

electrically joining a first terminal cluster to a corner part of said circuit pattern wiring; and electrically joining a second terminal cluster to the straight section of said circuit pattern wiring.

As pointed out hereinafter, the present invention provides important advantages. According to the foregoing structures and manufacturing methods, the bare IC chip has a pad section that is connected with terminals by way of TAB wiring and circuit pattern wiring, whereby the spacing between pads can be made small. As a result, this feature provides the significant advantage of providing, a smaller integrated circuit than can be obtained with a conventional process. In addition, the feature of mounting the bare IC chip on a substrate, provides the advantage of dissipating the heat generated in the integrated circuit section through the substrate. The heat dissipating feature provides the benefit of being able to fabricate an integrated circuit device of reduced dimensions and suppressed heat generation. Furthermore, another significant advantage resides in the use of a conventional and general purpose mounting machine to assemble the foregoing integrated circuit device into electronic equipment. Hence, the interconnections of the terminals with electronic equipment results in cost reduction.

The invention itself, together with further objects and attendant advantages, will best be understood by reference to the following detailed description taken in conjunction with the accompanying drawings.

DETAILED DESCRIPTION OF THE INVENTION

Figure 1:
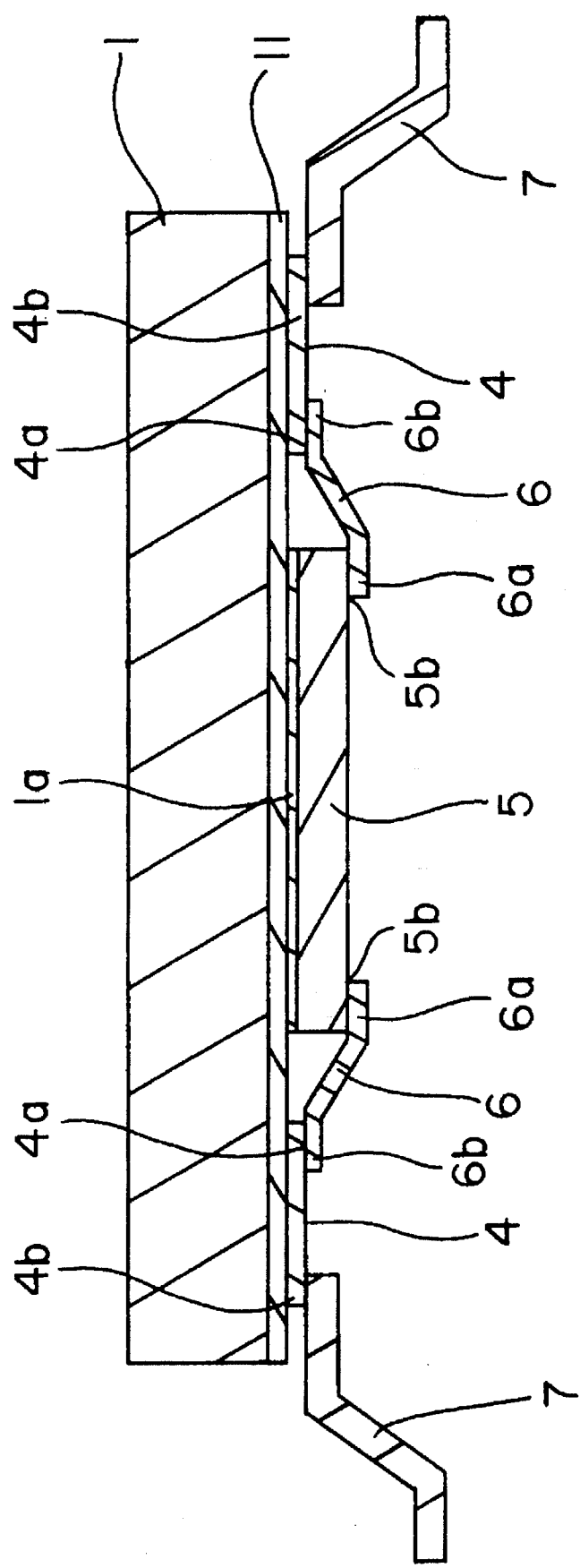
FIG. 1 is a cross-sectional view schematically showing the structures of a main portion of an integrated circuit device of the present invention.

FIG. 1 is a cross-sectional view schematically showing the fundamental structures or elements of an integrated circuit device of the present invention. In FIG. 1, a bare IC chip having an IC section and a plurality of pad sections 5b is mounted on a bare IC mounting section 1a. The mounting section 1a is located approximately in the central part of an electrically insulating layer 11 that is disposed on a first surface of a substrate 1. Electro-conductive circuit pattern wiring 4, of a specific configuration having a first end part 4a and a second end part 4b, is disposed on the peripheral part of said electrically insulating layer 11. TAB wiring 6 having a third end part 6a and a fourth end part 6b is disposed between the pads formed on the foregoing bare IC chip 5 and the first end part 4a of the circuit pattern wiring 4. The foregoing pad section 5b is electrically connected to the third end part 6b of the TAB wiring 6. The first end part 4a of the circuit pattern wiring 4 is electrically connected with the third end part 6a of the TAB wiring 6. The second end part 4b of the circuit pattern wiring 4 is electrically connected with terminal 7.

The substrate 1 can be, for example, a metal plate such as an aluminum plate, a silicon steel plate, a copper plate and the like. Also, ceramics or composite resins that are electrically insulating and of large thermal conductivity can be used. However, aluminum or silicon steel is particularly preferred. The configuration or shape of the substrate 1 can be, for example, a square, a rectangle or a polygon.

The electrically insulating layer 11 formed on the substrate 1 or metal plate can be, for example, an organic material such as epoxy resin and the like, or an inorganic material such as ceramic and the like.

The bare IC chip 5 can be, for example, a chip formed of an integrated circuit section disposed on a silicon wafer and pads 5b disposed on the integrated circuit section for a specific wiring purpose. The configuration of the bare IC chip 5 can be, for example, a square, a rectangle or a polygon.

The circuit pattern wiring 4 is structured, for example, to form an electro-conductive circuit pattern of a specified configuration, and intended for connecting the TAB wiring 6 with the terminal 7.

As an example of the foregoing circuit pattern wiring 4, a radially patterned wiring circuit can be formed around the bare IC chip 5 extending from the periphery thereof in the direction away from the bare IC chip 5. The circuit pattern wiring 4 is formed, for example, by way of printing an electro-conductive material, or by way of first attaching a metal foil on an insulating layer 11 and then etching off the metal foil to a specified configuration. The metal foil material can be, for example, copper or aluminum.

TAB wiring means wiring formed by means of a "Tape-Automated Bonding" method. The TAB wiring 6 is prepared by disposing a specified pattern of an electro-conductive metal on the surface of an electrically insulating plastic film for the purpose of connecting electrically the bare IC chip 5 to the circuit pattern wiring 4. The electrically insulating plastic film can be, for example, polyamide, polyamideimide, polyester or the like. The electro-conductive metal is formed, for example, by way of printing of an electro-conductive material, or attaching a metal foil on an insulating layer and then etching off the metal foil to a specified pattern. The metal foil material can be, for example, copper or aluminum.

Figure 6:
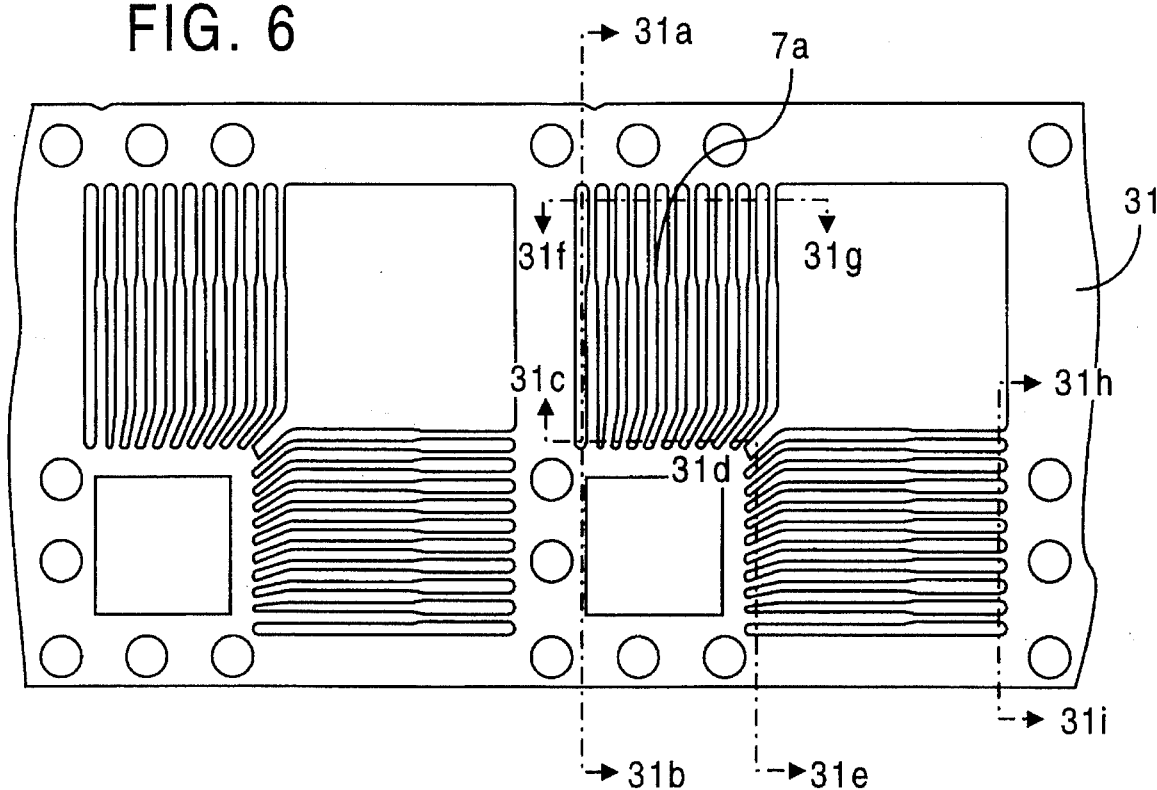
FIG. 6 is plan view to show a part of a hoop material used in the production of corner section terminal clusters for use in an integrated circuit device of the present invention.
Figure 7:
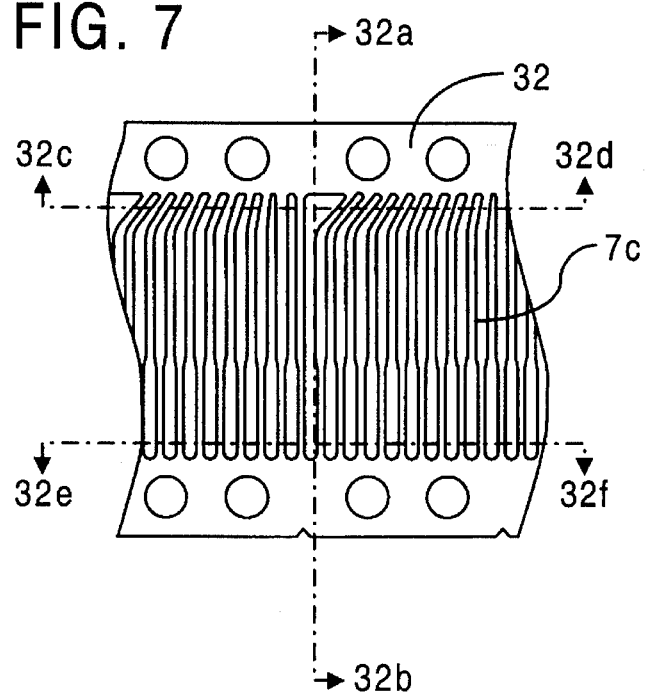
FIG. 7 is a plan view to show a part of a hoop material used in the production of straight section terminal clusters for use in an integrated circuit device of the present invention.

The terminal 7 is a connection terminal for connecting the integrated circuit device to other electronic equipment. The material of the terminal 7 can be, for example, Fe—Ni alloy, Cu alloy, iron, silicon steel sheet, aluminum, copper and the like. The configuration of the terminal 7 can be, for example, like an elongated piece of plate made by stamping from a hoop-like sheet of the foregoing materials. As described hereinafter, the terminal 7 can be part of a terminal cluster (FIGS. 6 and 7).

The advantages of structuring an integrated circuit device in the manner schematically shown in FIG. 1 are as follows:

As shown in FIG. 1, the integrated circuit device is structured, so that the pad section 5b (shown in FIG. 2), formed on the bare IC chip 5, is electrically connected to the terminal 7 by way of the circuit pattern wiring 4 and the TAB wiring 6. The fourth end part 6b of the TAB wiring 6 serves as an outer-lead section for the pad section 5b. The use of the first end part 4a of the circuit pattern wiring 4 for connection with the fourth end part 6b of the TAB wiring, once the positions are aligned, provides the advantage of being able to reduce the spacing between pads 5b. As a result, the bare IC chip 5 can be made smaller and a miniaturized integrated circuit device can be obtained.

Moreover, because the bare IC chip 5 is mounted on a substrate 1 of high thermal conductivity, the heat generated by the bare IC chip 5 can be dissipated through the substrate. As a result, the temperature rise of the bare IC chip 5 can be effectively suppressed.

Further, since the terminal 7 is part of the foregoing integrated circuit device, a conventional mounting machine of a general purpose type can be used in place of an expensive special purpose mounting machine to mount the integrated circuit device in other electronic equipment. The present invention makes it easier to connect the terminals of the integrated circuit device to the electronic equipment, resulting in a great reduction in the production cost.

Figure 2:
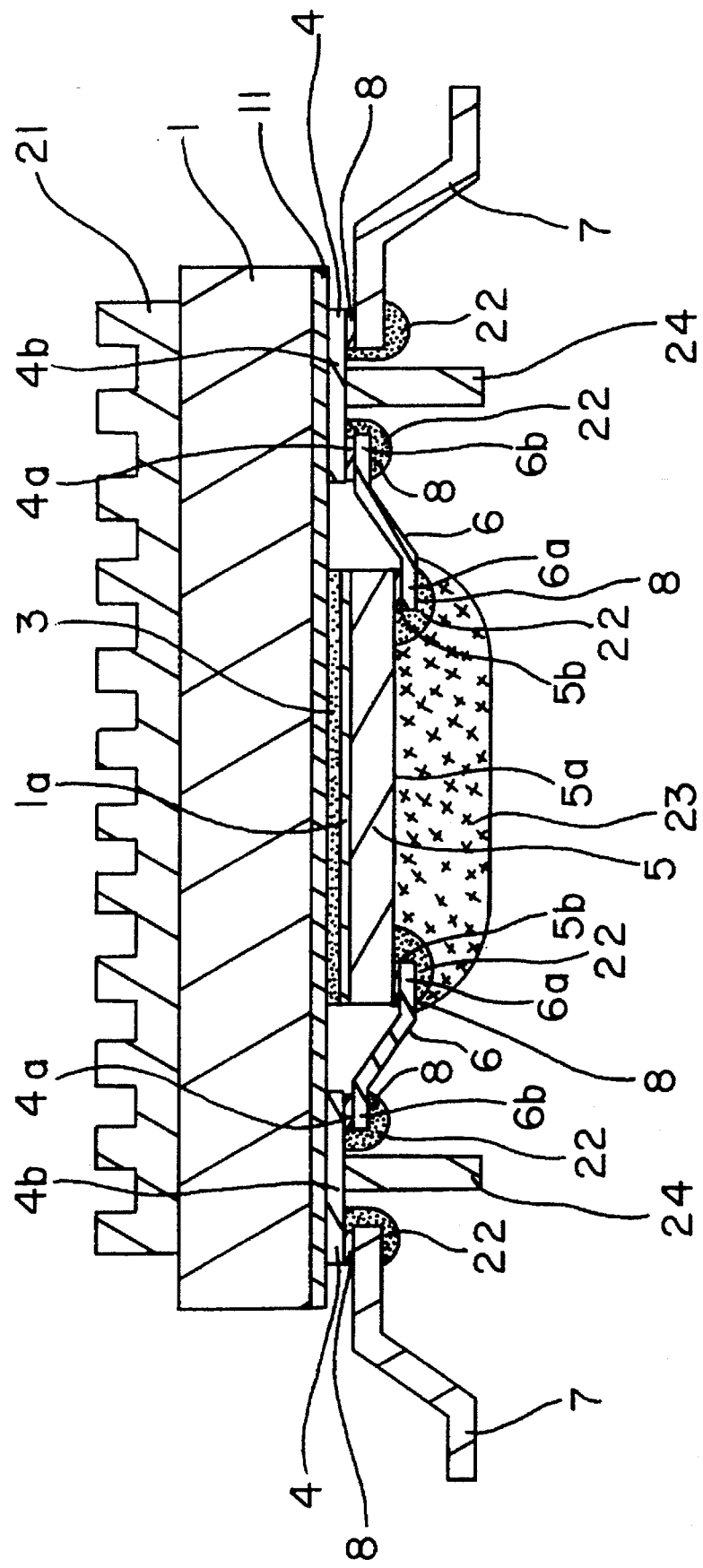
FIG. 2 is a cross-sectional view schematically showing the structures of a main portion of an exemplary embodiment of an integrated circuit device of the present invention.
Figure 3:
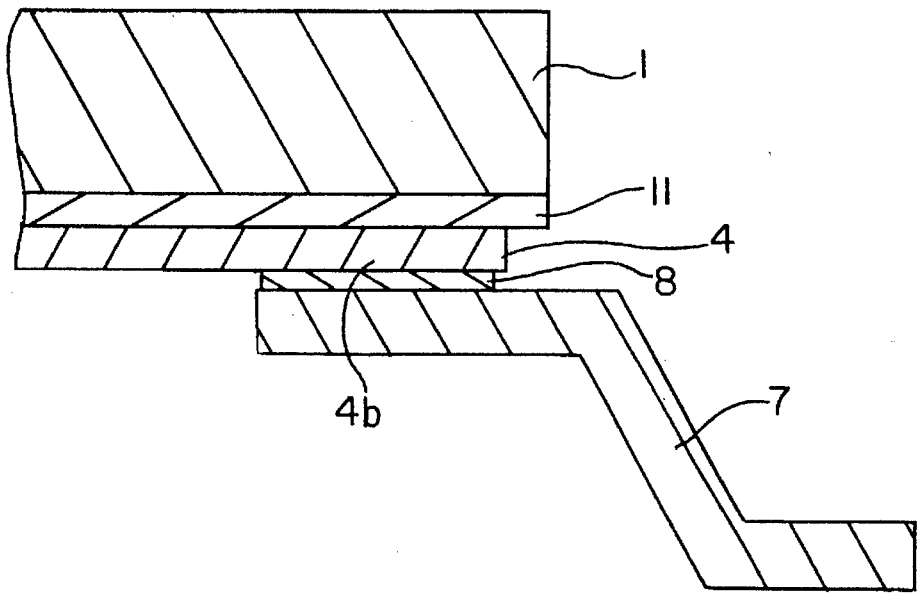
FIG. 3 is an enlarged detail of an end portion of FIG. 2.
Figure 4:
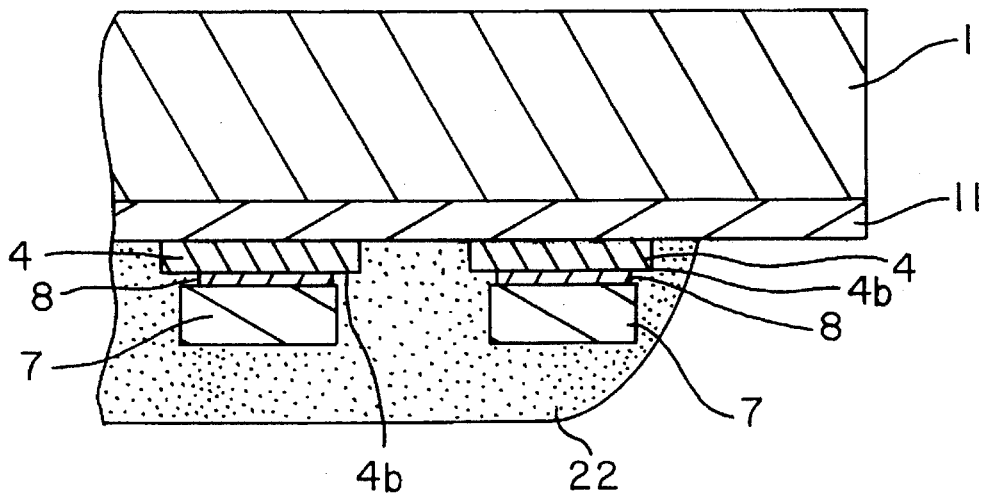
FIG. 4 is also an enlarged cross-sectional view of a portion of end view of FIG. 2.

Next, the exemplary embodiment of the present invention for an integrated circuit device will be explained in more detail. FIG. 2 is a cross-sectional view to illustrate schematically structures or elements of the exemplary embodiment of the present invention for an integrated circuit device. Also, FIGS. 3–4 are enlarged cross-sectional views of main portions of FIG. 2.

In FIG. 2, an electrically insulating layer 11 is disposed on a first surface of an approximately square substrate 1 formed of aluminum or silicon steel. The material of the electrically insulating layer 11 can be, for example, epoxy resin. An electro-conductive circuit pattern wiring 4 is formed on the peripheral part of the electrically insulating layer 11, said insulating layer 11 being disposed on the first surface of the foregoing substrate 1. An IC mounting section 1a is formed in the central part of the electrically insulating layer 11 disposed on the first surface of the substrate 1.

On the IC mounting section 1a, located in the central part of the electrically insulating layer 11 disposed on the first surface of the above substrate 1, is attached firmly a bare IC chip 5 by an adhesive 3. The adhesive 3 can be, for example, a material of high thermal conductivity such as silicon grease or the like. An integrated circuit section 5a, wherein specified electronic circuits are formed, is disposed on the foregoing bare IC chip 5, and a pad section 5b is disposed on the peripheral part of the integrated circuit section 5a.

The circuit pattern wiring 4 can be a radial circuit pattern, having a first end part 4a and a second end part 4b, disposed continuously and extending from the central part towards the end part of the substrate 1.

TAB wiring 6 is attached to the pad section 5b of the foregoing bare IC chip 5, and the circuit pattern wiring 4. Electrical connections are provided by means of an electro-conductive adhesive 8 applied between the pad section 5b of the foregoing bare IC chip 5 and a third end part 6a of the TAB wiring, and also between a fourth end part 6b of the TAB wiring and the first end part 4a of the circuit pattern wiring 4. The TAB wiring 6 can be preferably, for example, a copper foil formed on an insulating polyamide film.

Terminal 7 is attached by way of an electrical connection to the second end part 4b of the circuit pattern wiring 4. The material of the terminal 7 can be preferably, for example, a metal as Fe—Ni alloy, or Cu alloy or the like. The terminal 7 can be fabricated, for example, as part of a terminal cluster, wherein a plurality of terminals are linked and arranged to match the pattern of the circuit pattern wiring 4, by means of a press-punching method applied to a hoop-like material of the foregoing metals. A more detailed description of fabricating a terminal cluster is set out below with respect to FIGS. 6 and 7.

The electrical connection between the second end part 4b of the circuit pattern wiring 4 and the terminal 7 is made by using, for example, an electro-conductive adhesive 8.

The electro-conductive adhesive 8 can be, for example, solder, electro-conductive adhesive resin or electro-conductive inorganic material.

FIG. 3 is an enlarged view of an important part of the connection between circuit pattern wiring 4 and terminal 7 of an integrated circuit device as shown in FIG. 2, and the symbols for the component elements shown in FIG. 3 are the same as used in FIG. 2. In FIG. 3, a second end part 4b of the circuit pattern wiring 4 is joined to a terminal 7 by an electro-conductive adhesive 8. An integrated circuit device provided with the foregoing terminal 7 can be mounted to electronic equipment by using a mounting machine of general purpose type. As a result, a great reduction in production cost can be achieved.

Turning back to FIG. 2, a heat sink 21, for dissipating heat in the air, may be mounted on a second surface of the substrate 1, in addition to the foregoing structures. The heat sink 21 can be formed of a metal such as aluminum, copper, iron or the like, for example, and fixed onto the substrate 1 by bolts, for example.

Figure 8:
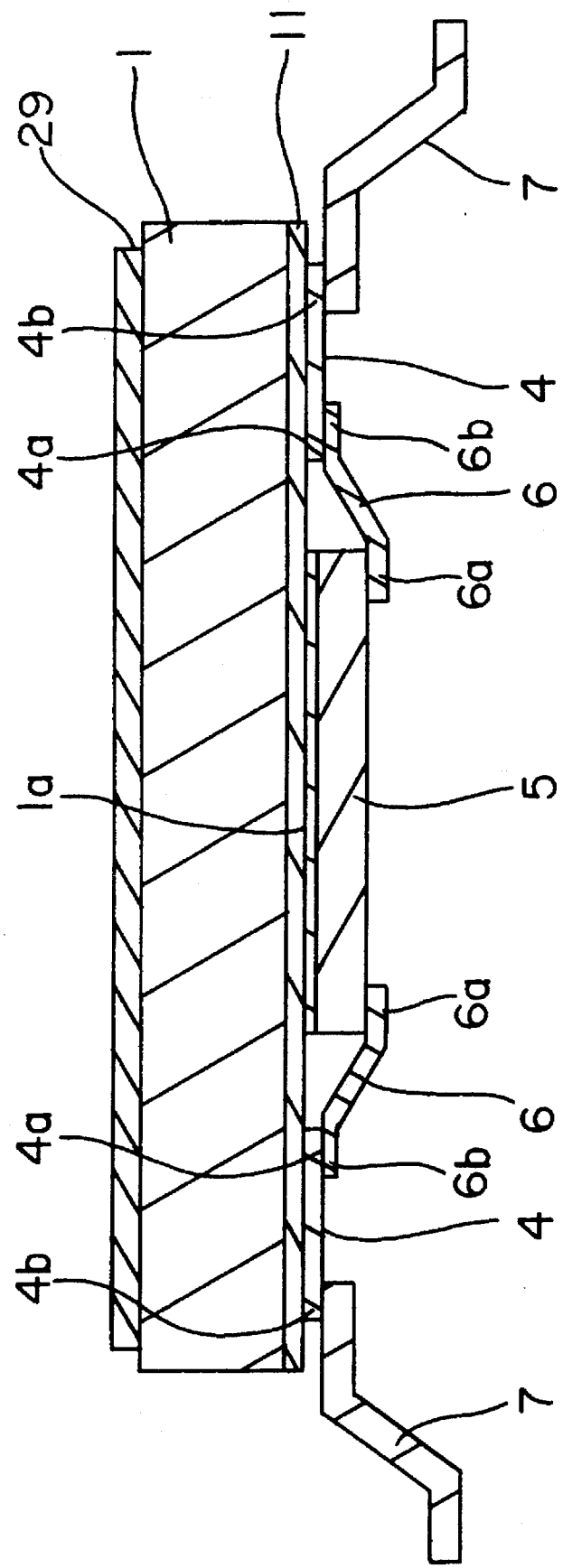
FIG. 8 is a cross-sectional view schematically showing structures of a main portion of another exemplary embodiment of an integrated circuit device of the present invention.

With the attachment of the heat sink 21 to the substrate 1, the heat generated at the IC chip 5 is taken by way of the substrate 1 to the heat sink 21, where the heat is effectively dissipated in the air. Also, as a variation, a second electrically insulating layer 29, as shown in FIG. 8, can replace the heat sink 21 of FIG. 2 for the same effect of heat dissipation. The electrically insulating layer 29 can be formed of a material such as epoxy resin, glass, or ceramics. The use of a metal such as aluminum, copper, iron or the like as the heat sink 21 provides a coefficient of heat radiation from about 0.03 to about 0.3 from the substrate 1. On the other hand, the use of an electrically insulating material such as epoxy resin, glass, or ceramics for the layer 29 improves the coefficient of heat radiation from the substrate 1 to about 0.9. As a result, the temperature rise of the IC chip can be suppressed more effectively.

Additionally, as shown in FIG. 2, a reinforcing coating material 22 of high mechanical strength can be used to cover regions when the electrical connections are made, such as the connection between the pad section 5b and the third end part 6a of TAB wiring 6, the fourth end part 6b of TAB wiring 6 and the first end part 4b of the circuit pattern wiring 4, and the second end part 4b of circuit pattern wiring 4 and terminal 7. The reinforcing coating material 22 can be, for example, epoxy resin, vinyl resin or glass. Covering the aforementioned various junctions of the electrical connections with the reinforcing coating material 22 will result in enhancing the strength of the junctions effectively.

FIG. 4 is an enlarged cross-sectional view of a main portion of a side view of FIG. 2 showing a pair of terminal 7 and the reinforcing coating material 22 applied in FIG. 2. More specifically, it is an enlarged cross-sectional view to show the vicinity of the junctions between the second end parts 4b of the circuit pattern wiring 4 and the terminals 7 that are used in the integrated circuit device shown in FIG. 2. All the symbols for each respective component element are the same as used in FIG. 2. FIG. 4, also shows the electro-conduction adhesive 8 used as the connection between the second end parts 4b of the circuit pattern wiring 4 and the terminals 7. The connection region is covered by the reinforcing coating material 22. In addition to the foregoing structures, an insulating material 23 can be used further to cover the bare IC chip 5 alone or the bare IC chip 5 and the pad section thereof together, as shown in FIG. 2. The insulating material 23 can be, for example, epoxy resin, silicon resin, polyester resin, synthetic rubber or glass. With the insulating material 23 incorporated in the structures, it is possible to obtain an integrated circuit device of enhanced long-term reliability.

An additional feature of the present invention is also shown in FIG. 2. FIG. 2 shows a plurality of supports 24 that are placed or fixed at specified positions along the circuit pattern wiring 4 on the first surface of the substrate 1 between the TAB wiring 6 and the terminal 7 for the purpose of protecting the integrated circuit device against external stresses.

The support 24 can be, for example, a plastic material of high mechanical strength. With the use of the supports 24, an excessive stress applied to a terminal 7 can be borne by a support 24 to prevent effectively the disconnection between the terminal 7 and the circuit pattern wiring 4 from taking place.

Figure 9:
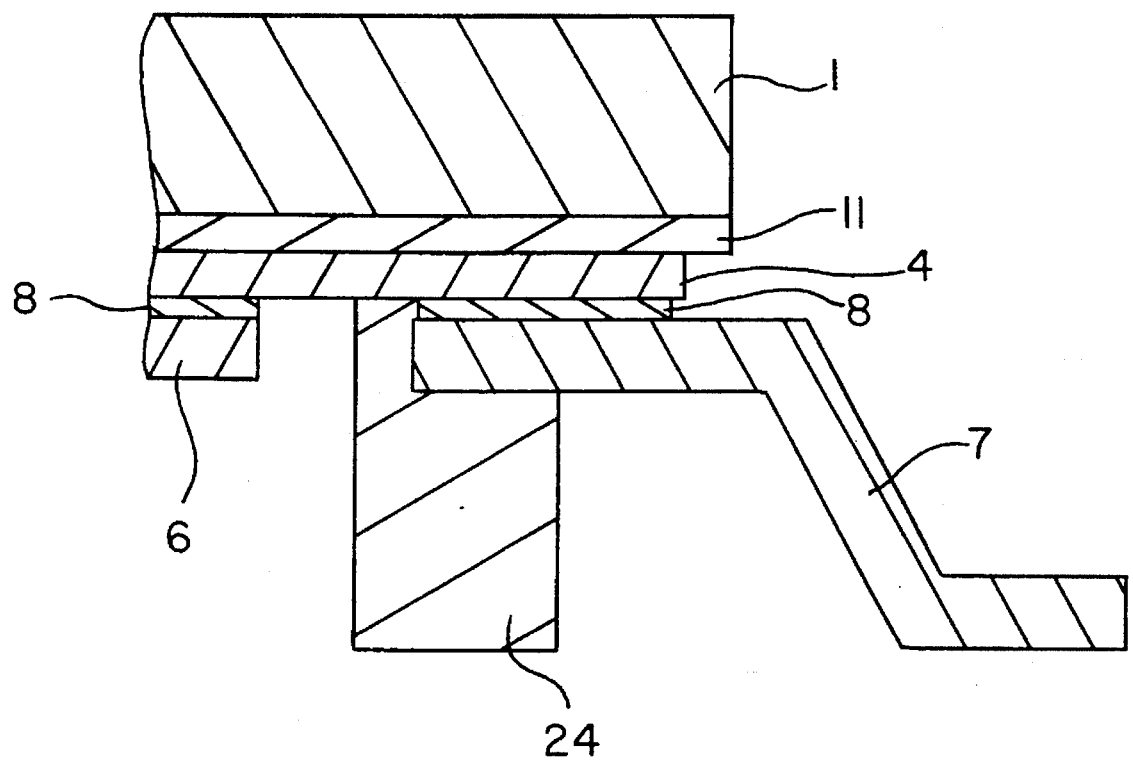
FIG. 9 is an enlarged partial cross-sectional view schematically showing a detail of a support for an integrated circuit device of the present invention.

Also, as shown in FIG. 9, the support 24 can be disposed over the terminal 7, rather than between the TAB wiring 4 and the terminal 7 for the same effect as in the foregoing.

Next, FIGS. 5(a)–5(d) are used to explain a manufacturing method for an integrated circuit device of the present invention.

FIGS. 5(a)–5(d) illustrate schematically the process of the manufacturing an exemplary embodiment of an integrated circuit device of the present invention.

Figure 5A:
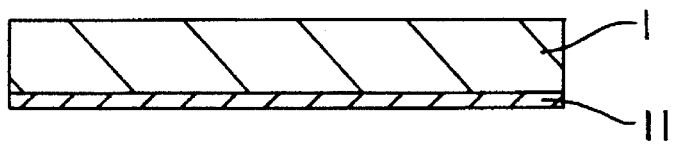
FIGS. 5a–5d depict the steps in the manufacturing method for an integrated circuit device of the present invention.
Figure 5B:
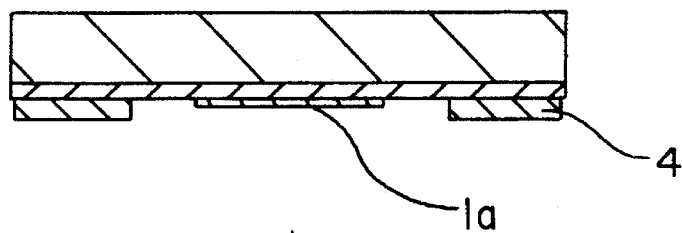

In FIG. 5(a), a first surface of a substrate 1 is covered with an insulating layer 11. Next, in FIG. 5(b), an IC mounting section 1a and circuit pattern wiring 4 of a specified configuration are formed on the central part and the peripheral part of the first surface of an approximately square substrate 1 having an electrically insulating layer 11, respectively.

Figure 5C:
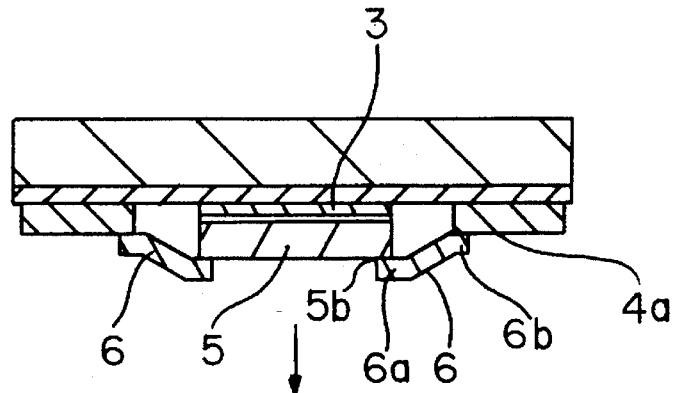
Figure 5D:
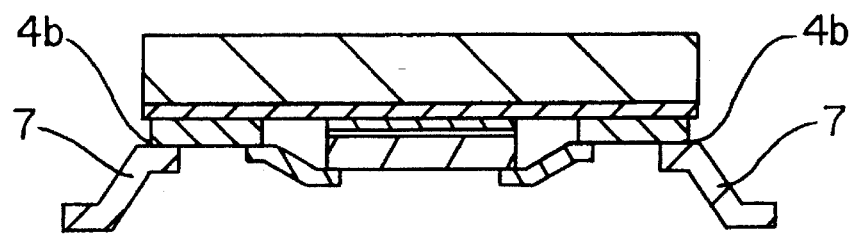

Then, as shown in FIG. 5(c), the foregoing IC mounting section 1a and the bare IC chip 5 are connected with each other by an adhesive 3 so as to have the foregoing bare IC chip 5 disposed on the IC mounting section 1 on the central part of the electrically insulating layer 11. The pad section 5b formed on the peripheral part of the bare IC chip 5 is electrically connected with the inner third end part 6a inside the TAB wiring 6. An outer fourth end part 6b of the TAB wiring 6 is electrically connected to an inner first end part 4a of the circuit pattern wiring 4. Also, the inner third end part 6a of the TAB wiring 6 is electrically connected to the pad section 5b of the IC chip 5.

Further, the terminal 7 is electrically connected to the outer second end part 4b of the circuit pattern wiring 4.

Each respective connection between the pad section 5b and the third end part 6a of the TAB wiring 6, between the fourth end part 6b of the TAB wiring 6 and the first end part 4a of the circuit pattern wiring 4, and between the second end part 4b of the circuit pattern wiring 4 and the terminal 7 is made by using, for example, an electro-conductive adhesive 8.

Next, the method of connecting and manufacturing terminal clusters for an integrated circuit device will be explained. The present invention is characterized by electrically connecting a terminal cluster comprising a plurality of terminals 7 to the second end part 4b of the circuit pattern wiring 4. According to this invention, a first terminal cluster can be electrically connected to the outer end of a corner of a circuit pattern wiring. Also, a second terminal cluster can be electrically connected to the outer end of a straight section of a circuit pattern wiring.

Figure 10A:
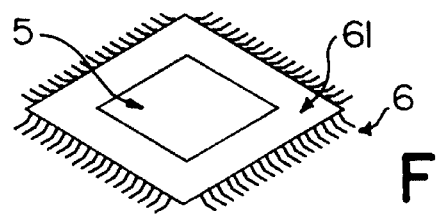
FIGS. 10a–10c are the bottom view of the bar IC chip and TAB wiring (FIG. 10a), the insulating film and circuit pattern wiring (FIG. 10b), and the metal terminals (FIG. 10c) of the present invention.

As shown in FIG. 10a, the TAB wiring 6 is aligned with the peripheral part of the electrically insulating film 61, while the bare IC chip 5 is aligned with the central part.

Figure 10B:
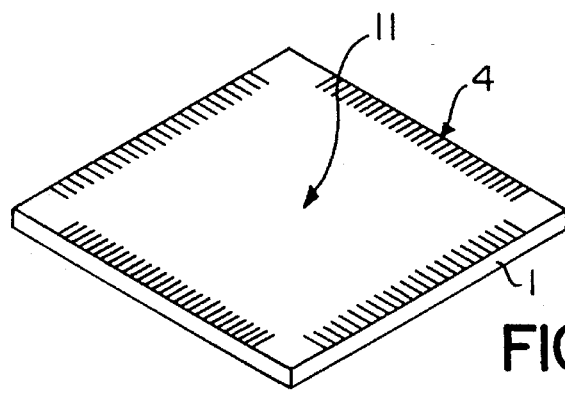

As shown in FIG. 10b, the circuit pattern wiring 4 is formed on the peripheral part of the surface of the electrically insulating layer 11 of the substrate 1.

Figure 10C:
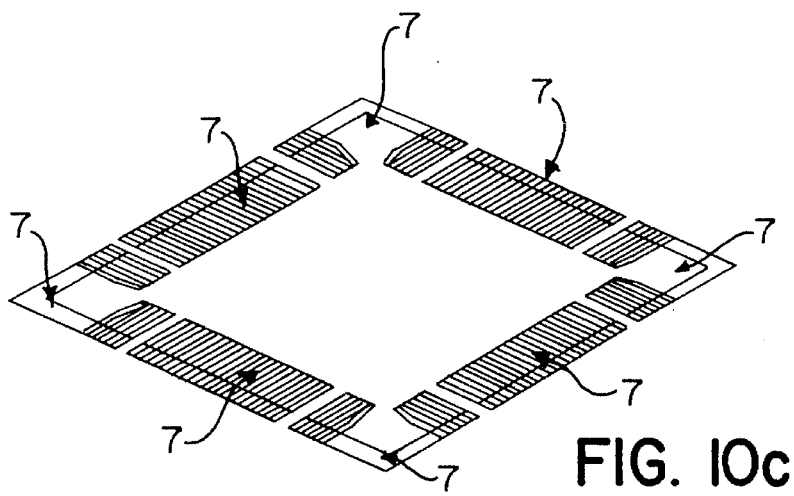

As shown in FIG. 10c, the metal terminal 7 is formed with press-punched in a rectangular shape.

Figure 10D:
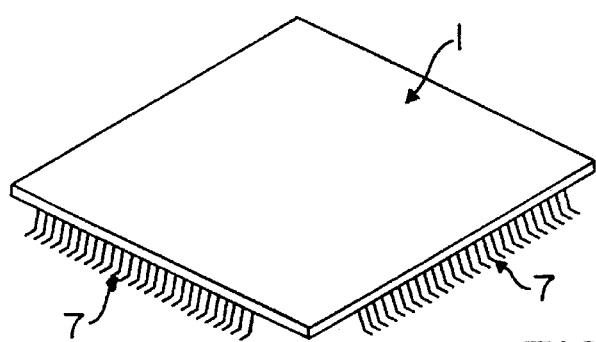
FIG. 10d shows the top view of a substrate with metal terminals of the present invention.

As shown in FIG. 10d, the circuit pattern wiring 4 formed on the substrate 1, the bare IC chip 5, the TAB wiring 6 and the terminal 7 are fabricated. The spacing between each terminal of said terminals 7 is larger than a spacing between each pad of said pad sections of the bare integrated circuit chip 5, as is apparent from FIGS. 10a–10d.

A manufacturing method for the first terminal cluster and second terminal cluster, as used in the foregoing integrated circuit device, is explained below.

FIG. 6 is a plan view of a hoop material used in a manufacturing method for a first terminal cluster for use in providing the electrical connection to a circuit pattern wiring having a corner.

First, unwanted portions of the hoop material 31 are stamped out. The remaining portions of a specified configuration will be further processed into first terminal clusters 7a and 7b for use on the corners of an integrated circuit device.

Then, the hoop material 31 is separated by shearing along the line joining 31a and 31b into two pieces as the interim materials, each comprising the first terminal clusters 7a and 7b to be used in one corner.

Further, each respective piece of the interim material is sheared along the line joining 31c, 31d and 31e to eliminate unwanted portions.

Each respective end part of the sheared first terminal clusters 7a and 7b is electrically joined to an outer corner of a second end part 4b of the circuit pattern wiring 4.

Then, the joined terminal clusters 7a ad 7b are bent downwards.

Next, unwanted portions are eliminated by shearing the terminal clusters 7a and 7b along the lines joining 31f and 31g, and 31h and 31i, respectively.

Thus, a number of terminals 7 are fabricated together as first terminal clusters 7a and 7b and used in a corner of a circuit pattern wiring.

FIG. 7 is a plan view of a hoop material used in a manufacturing method for a second terminal cluster for use in providing the electrical connection to a circuit pattern having straight sides, such as one formed on an approximately square substrate 1.

First, unwanted portions are stamped out from a hoop material 32 of a specified configuration, with the remaining portion being processed into a second terminal cluster 7c for use along the straight part of the substrate 1 or more specifically, the straight part of the circuit pattern wiring 4.

Then, the hoop material 32 is separated by shearing along the line joining 32a and 32b into two pieces as the interim materials, each comprising a terminal cluster 7c for use along one straight section.

Each respective end part of a sheared second terminal cluster 7c is electrically joined to an outer straight section of the second end part 4b of the circuit pattern wiring 4.

Then, the joined terminal cluster 7c is bent downwards.

Next, unwanted portions are eliminated by shearing the terminal cluster 7c along the line joining 31e and 31f.

Thus, a number of terminals 7 are fabricated together as a second terminal cluster 7c and used in a straight section of a circuit pattern wiring.

The structure and process described above provide a number of significant advantages. According to the foregoing use of a circuit pattern wiring, it becomes possible to make the spacing between pads of an IC chip smaller because the fourth end part 6b of the TAB wiring 6 and the first end part 4a of the circuit pattern wiring 4 need only be aligned and connected with each other collectively. As a result, a smaller integrated circuit device can be readily realized. Besides, another benefit is in making it possible to produce an integrated circuit device of arbitrary dimensions by fabricating terminal clusters in the shape of the integrated circuit device and connecting the clusters to a circuit pattern. As a result, a great cost reduction can be achieved, and the process of joining the terminals to electronic equipment is made much easier since conventional mounting equipment can be used.

As yet another advantage of the present integrated circuit device is the use of a heat sink to dissipate the heat and make the device more reliable. Also, the use of a reinforcing coating material at the connection junctions and the use of supports near the terminals, provide protection against failure due to external stresses.

Of course, it should be understood that a wide range of changes and modifications can be made to the preferred embodiment described above. It is therefore intended that the foregoing detailed description be understood that it is the following claims, including all equivalents, which are intended to define the scope of this invention.

What is claimed is:

1. An integrated circuit device comprising:

a substrate with an electrically insulating layer formed on a first surface thereof;

a bare integrated circuit chip mounted on the central part of said electrically insulating layer, said bare integrated circuit chip having pad sections;

circuit pattern wiring formed on the peripheral part of said electrically insulating layer;

TAB wiring electrically connecting said circuit pattern wiring and said bare integrated circuit chip; and terminals electrically connected with said circuit pattern wiring, said terminals protruding from the peripheral part of said substrate and having a spacing between terminals larger than a spacing between each pad of said pad sections, each terminal connected with a pad by way of said TAB wiring and said circuit pattern wiring.

2. The integrated circuit device according to claim 1, further comprising a heat sink mounted on a second surface of said substrate.

3. The integrated circuit device according to claim 1, further comprising a second electrically insulating layer disposed on the second surface of said substrate, wherein said second electrically insulating layer comprises epoxy resin, glass or ceramic material.

4. The integrated circuit device according to claim 1, further comprising a reinforcing coating material applied to at least one junction selected from the junctions between said bare integrated circuit chip and said TAB wiring, said TAB wiring and said circuit pattern wiring, and said pattern wiring and said terminals.

5. The integrated circuit device according to claim 1, further comprising a support for protection against external stresses mounted on said circuit pattern wiring.

6. An integrated circuit device comprising:

a quadrilateral substrate with an electrically insulating layer formed on the first surface thereof;

an electro-conductive circuit pattern wiring having a first end part and second end part, and disposed on the peripheral part of said first surface of said substrate;

a bare integrated circuit chip having an integrated circuit section and pad section, and mounted on the inside of said circuit pattern wiring disposed on said electrically insulating layer;

terminals electrically connected to said second end part of said circuit pattern wiring, said terminals including a first terminal cluster in the form of a corner section and a second terminal cluster in the form of a straight section; and TAB wiring having a third end part and a fourth end part, said third end part electrically connected to said pad section and said fourth end part electrically connected to said first end part of said circuit pattern wiring, wherein said terminals are electrically connected to said second end part of said circuit pattern wiring by:

joining said first terminal cluster to a corner section of said second end part, and joining said second terminal cluster to a straight section of said second end part.

* * * * *